United States Patent [19]

Stopperan

[11] Patent Number: 5,719,749
[45] Date of Patent: Feb. 17, 1998

[54] PRINTED CIRCUIT ASSEMBLY WITH FINE PITCH FLEXIBLE PRINTED CIRCUIT OVERLAY MOUNTED TO PRINTED CIRCUIT BOARD

[75] Inventor: Jahn J. Stopperan, Lakeville, Minn.

[73] Assignee: Sheldahl, Inc., Northfield, Minn.

[21] Appl. No.: 685,425

[22] Filed: Sep. 26, 1994

[51] Int. Cl.⁶ .................. H05K 1/11; H05K 1/14; H01R 23/72
[52] U.S. Cl. .................. 361/769; 174/254; 174/261; 361/749; 361/790; 361/767; 361/803; 439/66; 439/91
[58] Field of Search .................. 174/254, 255, 174/259, 260, 261–266, 268, 116, 117 A; 257/700, 723, 724; 361/760, 749, 767, 769, 771, 784, 790, 803, 807; 439/55, 59, 65, 66, 67, 69, 74, 77, 83, 85, 91, 86

[56] References Cited

U.S. PATENT DOCUMENTS

| | | | |
|---|---|---|---|
| 3,868,724 | 2/1975 | Perrino | 357/65 |
| 3,965,568 | 6/1976 | Gooch | 29/583 |
| 4,037,047 | 7/1977 | Taylor | 174/68.5 |
| 4,064,357 | 12/1977 | Dixon et al. | 174/68.5 |
| 4,064,622 | 12/1977 | Morris et al. | 29/625 |
| 4,219,882 | 8/1980 | Cooper et al. | 365/2 |
| 4,385,202 | 5/1983 | Spinelli et al. | 174/68.5 |
| 4,472,762 | 9/1984 | Spinelli et al. | 361/386 |
| 4,508,399 | 4/1985 | Dowling et al. | 339/17 |
| 4,546,406 | 10/1985 | Spinelli et al. | 361/386 |
| 4,628,406 | 12/1986 | Smith et al. | 361/386 |
| 4,647,959 | 3/1987 | Smith | 357/74 |
| 4,700,473 | 10/1987 | Freyman et al. | 29/846 |
| 4,709,468 | 12/1987 | Wilson | 437/209 |
| 4,728,751 | 3/1988 | Canestaro et al. | 174/68.5 |
| 4,730,238 | 3/1988 | Cook | 361/414 |
| 4,735,847 | 4/1988 | Fujiwara et al. | 428/209 |
| 4,748,495 | 5/1988 | Kucharek | 357/82 |
| 4,772,936 | 9/1988 | Reding et al. | 357/80 |
| 4,774,634 | 9/1988 | Tate et al. | 361/400 |
| 4,800,461 | 1/1989 | Dixon et al. | 361/398 |
| 4,812,213 | 3/1989 | Barton et al. | 204/15 |
| 4,814,855 | 3/1989 | Hodgson et al. | 174/52.4 |
| 4,862,153 | 8/1989 | Nakatani et al. | 340/719 |
| 4,873,123 | 10/1989 | Canestaro et al. | 427/96 |
| 4,878,098 | 10/1989 | Saito et al. | 357/68 |
| 4,893,216 | 1/1990 | Hagner | 361/406 |
| 4,906,823 | 3/1990 | Kushima et al. | 228/245 |
| 4,924,352 | 5/1990 | Septfons | 361/388 |
| 4,928,206 | 5/1990 | Porter et al. | 361/385 |
| 4,942,452 | 7/1990 | Kitano et al. | 357/68 |
| 4,945,029 | 7/1990 | Bronnenberg | 430/316 |
| 4,980,034 | 12/1990 | Volfson et al. | 204/38.4 |
| 4,992,850 | 2/1991 | Corbett et al. | 357/72 |
| 5,004,639 | 4/1991 | Desai | 428/138 |
| 5,019,673 | 5/1991 | Juskey et al. | 174/52.2 |
| 5,021,630 | 6/1991 | Benko et al. | 219/121.64 |
| 5,044,053 | 9/1991 | Kopel et al. | 29/25.35 |

(List continued on next page.)

FOREIGN PATENT DOCUMENTS

| | | |
|---|---|---|
| 147856 A3 | 7/1985 | European Pat. Off. |
| 170703 A1 | 2/1986 | European Pat. Off. |
| 265212 A1 | 4/1988 | European Pat. Off. |
| 346525 A2 | 12/1989 | European Pat. Off. |
| 58-023174 | 2/1983 | Japan . |
| 61-049499 | 3/1986 | Japan . |
| 62-023198 | 1/1987 | Japan . |
| 2068645 | 8/1981 | United Kingdom . |
| 2230903 | 11/1989 | United Kingdom . |

OTHER PUBLICATIONS

Art Burkhart, "Recent Developments in Flip Chip Technology", *Surface Mount Technology*, Jul. 1991, pp. 41–44.

*Primary Examiner*—Donald D. Sparks
*Attorney, Agent, or Firm*—Merchant, Gould, Smith, Edell, Welter & Schmidt, P.A.

[57] ABSTRACT

A printed circuit assembly includes a fine pitch flexible printed circuit overlay bonded to a normal pitch printed circuit board. The fine pitch flexible printed circuit overlay may provide increased packaging density, direct chip attachment and/or complex routing with a minimal cost impact on the overall printed circuit assembly.

31 Claims, 2 Drawing Sheets

U.S. PATENT DOCUMENTS

| | | | |
|---|---|---|---|
| 5,067,004 | 11/1991 | Marshall et al. | 357/71 |
| 5,072,074 | 12/1991 | DeMaso et al. | 174/254 |
| 5,084,961 | 2/1992 | Yoshikawa | 29/840 |
| 5,095,628 | 3/1992 | McKenney et al. | 29/846 |
| 5,099,393 | 3/1992 | Bentlage et al. | 361/413 |
| 5,102,343 | 4/1992 | Knight et al. | 439/67 |
| 5,112,462 | 5/1992 | Swisher | 205/165 |
| 5,121,297 | 6/1992 | Haas | 361/398 |
| 5,132,879 | 7/1992 | Chang et al. | 361/412 |
| 5,137,791 | 8/1992 | Swisher | 428/612 |
| 5,175,047 | 12/1992 | McKenney et al. | 428/209 |
| 5,261,593 | 11/1993 | Casson et al. | 228/180.22 |
| 5,306,670 | 4/1994 | Mowatt et al. | 437/209 |
| 5,349,500 | 9/1994 | Casson et al. | 361/749 |
| 5,364,707 | 11/1994 | Swisher | 428/612 |
| 5,435,732 | 7/1995 | Angulas et al. | 174/254 |

PRINTED CIRCUIT ASSEMBLY WITH FINE PITCH FLEXIBLE PRINTED CIRCUIT OVERLAY MOUNTED TO PRINTED CIRCUIT BOARD

FIELD OF THE INVENTION

The invention is directed to a printed circuit assembly and a method of manufacture thereof. In particular, the invention is directed to a printed circuit assembly and a method of manufacture having a fine pitch flexible printed circuit overlay electrically and mechanically interconnected to a printed circuit board, particularly of the type having a pitch suitable for use in cost sensitive applications.

BACKGROUND OF THE INVENTION

Printed circuit assembly processes and other electronic interconnection technologies are continuously being improved in terms of performance, reliability, packaging density and environmental resistance.

Through the use of thinner substrate materials, adhesiveless metal deposition processes, and metallized through hole processes, double sided printed circuit boards having thicknesses as low as 50 microns or less, having minimum circuit trace pitches (i.e., the distance between centers of adjacent circuit traces) as low as 50 microns (25 micron line width and 25 micron line spacing) and 25 micron diameter through holes, or vias, may be constructed. Moreover, through the use of conductive adhesives such as those forming anisotropic adhesive layers, thin multilayer constructions (i.e., assemblies having 3 or more conductive layers) may be fabricated, offering even higher packaging density for a given surface area.

In addition, the overall performance and packaging density of printed circuit assemblies have been further benefited by advancements in integrated circuit chip mounting techniques, such as direct chip attachment and other surface mount technologies, whereby an unpackaged integrated circuit chip is directly mounted to a supporting substrate. Examples of direct chip attachment technologies include tape automated bonding (tab), wire lead bonding, flip chip and controlled collapse chip connection (C4), and other various re-distribution technologies. Many of these technologies are used in forming multi-chip modules, whereby a plurality of unpackaged chips, and the associated wiring for signal traces, power traces and ground planes, is provided on a single carrier which may be attached to a printed circuit board.

While all of the above technological advancements have improved the performance, reliability and packaging density of printed circuit assemblies, many of the technologies are too expensive for some commercial applications. In particular, many cost sensitive applications still rely on conventional printed circuit board (PCB) manufacturing, typically using glass epoxy hardboard substrates with one or more copper laminate circuit layers bonded to the opposing surfaces and interconnected by means of drilled and plated through holes.

The practical economic limits on packaging density for cost sensitive applications using conventional PCB fabrication processes are about 0.25 millimeter (mm) minimum pitch (125 micron line widths and spaces) and 0.3125 mm through holes. By applying more advanced fabrication technologies, including multilayer circuit fabrication, adhesiveless metal deposition, etc., greater packaging densities may be obtained on PCB's, currently as small as 0.1 mm pitch (50 micron line widths and spaces) and 0.15 mm vias. However, these special processing techniques significantly increase the cost of the PCB, thus bringing the PCB within the realm of high performance/high cost applications and beyond the practical economic limits for most cost sensitive PCB applications.

A significant gap in performance and packaging density exists between high performance/high cost printed circuit technologies, and cost sensitive printed circuit board technologies. Many applications fall into this gap in terms of moderate performance and cost requirements. Therefore, a need has arisen for an intermediate technology which can applying the benefits of advanced printed circuit fabrication technologies to traditional printed circuit board applications with a minimum amount of cost impact on the final assemblies.

SUMMARY OF THE INVENTION

The invention addresses these and other problems associated with the prior art in providing a fine pitched flexible printed circuit overlay suitable for attachment to conventional normal pitch printed circuit boards. The invention enables the reliability and packaging density benefits of advanced printed circuit fabrication technologies to be applied to cost sensitive applications with a minimum amount of cost impact. Different technologies, including multilayer fabrication technologies and direct chip attachment technologies, may be used in a reliable yet cost effective manner.

Therefore, according to one aspect of the invention, a printed circuit assembly is provided, including a normal pitch printed circuit board having bonding pads arranged into a footprint on a surface thereof, a fine pitch flexible printed circuit overlay having bonding pads arranged into a footprint on a surface thereof, and connecting means for mechanically connecting the overlay to the board and electrically connecting the bonding pads on the overlay to the bonding pads on the board. The overlay may have a minimum pitch of less than about 0.25 mm and at least one through hole with a diameter of less than about 0.3125 mm.

According to another aspect of the invention, a printed circuit assembly is provided, including a normal pitch printed circuit board having bonding pads arranged into a footprint on a surface thereof, a fine pitch flexible printed circuit overlay having bonding pads arranged into a footprint on a surface thereof and having a minimum circuit trace pitch of less than about 0.1 mm, and a conductive adhesive layer, interposed between the overlay and the board, for mechanically connecting the overlay to the board and electrically connecting the bonding pads on the overlay to the bonding pads on the board. The overlay includes an adhesiveless laminate including a flexible dielectric substrate, first and second conductive layers of conductive material secured to opposing surfaces of the flexible dielectric substrate through adhesiveless interconnections, and at least one metallized through hole defined through the flexible dielectric substrate and having conductive material deposited thereon to electrically interconnect the first and second conductive layers. The metallized through hole may have a diameter of less than about 0.15 mm.

According to a further aspect of the invention, a method of making a printed circuit assembly is provided, including the step of electrically and mechanically interconnecting a fine pitch adhesiveless laminate flexible printed circuit overlay to a normal pitch printed circuit board. The overlay and board each include bonding pads arranged into cooperative footprints for forming the electrical connections therebetween. The overlay also includes opposing conductive layers secured to opposing surfaces of a flexible dielectric substrate through adhesiveless interconnections. The conductive layers may have a minimum circuit trace pitch of less than about 0.1 mm and are electrically interconnected to one another through at least one metallized through hole defined through the flexible dielectric substrate and having a diameter of typically less than about 0.15 mm.

These and other advantages and features which characterize the invention are pointed out with particularity in the claims annexed hereto and forming a further part hereof. However, for a better understanding of the invention, and the advantages and objectives obtained by its use, reference should be made to the Drawing which forms a further part hereof, and to the accompanying descriptive matter, in which there is described a preferred embodiment of the invention.

DETAILED DESCRIPTION OF THE PREFERRED EMBODIMENTS

Figure 1:
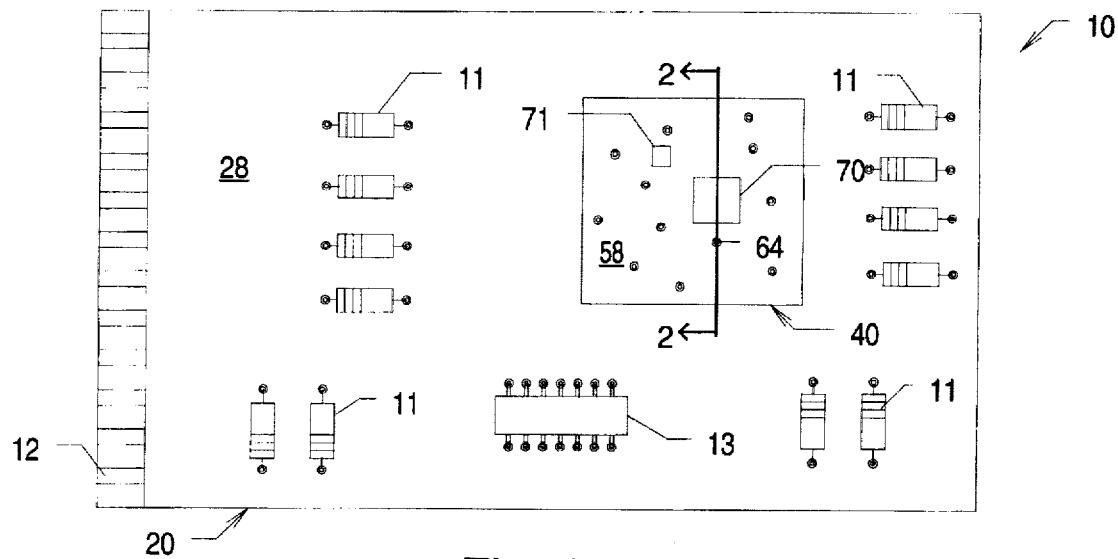
FIG. 1 is a top plan view of a printed circuit assembly consistent with the principles of the invention.

Turning to the Drawing, wherein like numbers denote like parts throughout the several views, FIG. 1 shows a printed circuit assembly 10, including a normal pitch conventional printed circuit board (PCB) 20 with a high density (fine pitch) flexible printed circuit overlay 40 mounted thereto. Through the use of the invention, features such as fine pitch, multiple layers and direct chip attachment may be provided on PCB 20 by overlay 40 with reduced cost impact on assembly 10. It will be appreciated that any number of separate overlays may be mounted to one or both sides of PCB 20.

By a "normal pitch" board, what is meant is a board having a minimum line width and spacing for circuit traces and a minimum diameter via size that does not require special processing which significantly increases the cost of the board. By a "fine pitch" board or overlay, what is meant is a board or overlay having a minimum line width and spacing for circuit traces and/or a minimum via size that does require some degree of more expensive special processing techniques. While the dividing line between a normal pitch and a fine pitch board is currently at about 0.25 mm minimum pitch and 0.3125 mm vias, it will be appreciated that as the state of the art advances, what is conventionally thought of as being a "normal" or "fine" pitch will decrease.

Irrespective of the particular dividing line between "normal" and "fine" pitch boards, for the purposes of the invention, it has been found that using an overlay with a minimum pitch of less than about 60 percent of the PCB pitch, more preferably less than about 40 percent of the PCB pitch, and even more preferably less than about 20 percent of the PCB pitch, provides significant cost advantages over conventional PCB fabrication processes. However, it will be appreciated that the overlay may be used with PCB's of any known pitch consistent with the invention.

Printed circuit board 20 is preferably a conventional normal pitch printed circuit board manufactured by well known techniques. For example, as shown in FIG. 1, a PC expansion card application is shown, having connectors 12 disposed along one edge thereof. Overlay 40 in this application may contain much of the necessary electrical circuit traces on assembly 10, with PCB 20 merely providing the edge connectors for connection to a PC expansion slot and other peripheral components. It will be appreciated, however, that PCB 20 may contain the majority of the circuit traces and processing on the assembly, with overlay 40 providing only additional processing capability as necessary.

In addition to overlay 40, any of a number of conventional components may be mounted to PCB 20, including passive or active components such as resistors 11, as well as packaged integrated circuits such as dual in-line package 13. Other components, such as jumpers, capacitors, transistors, diodes, inductors, etc. may also be mounted thereon as will be appreciated by one skilled in the art.

Figure 2:
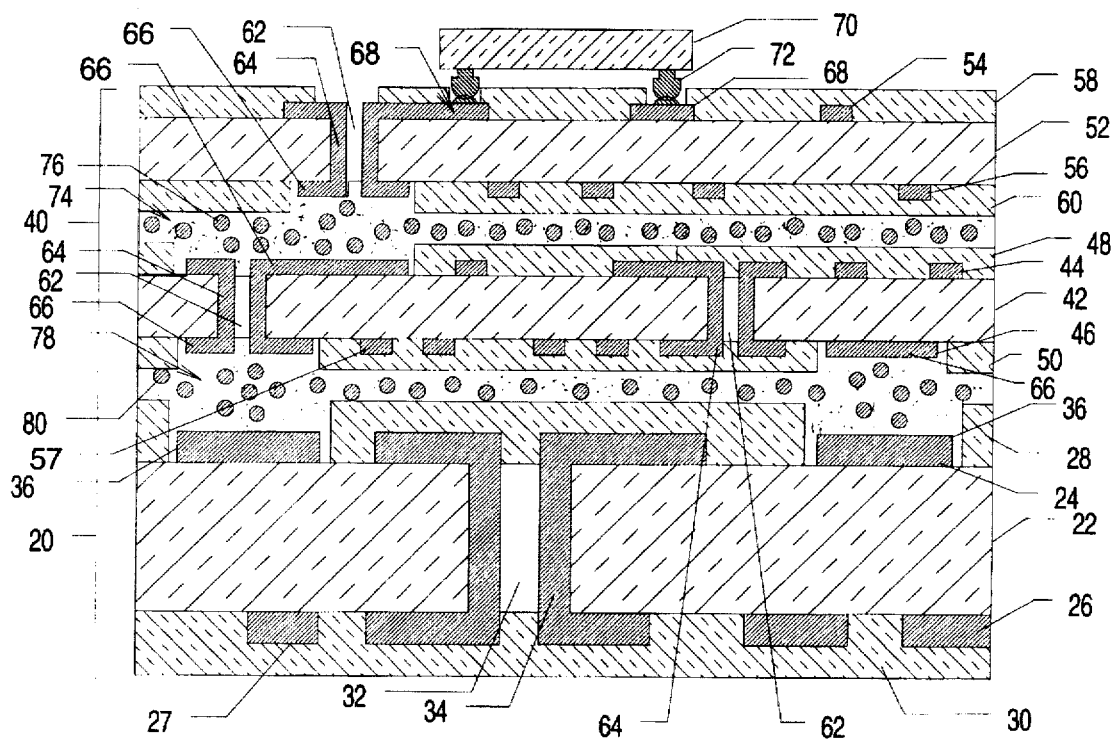
FIG. 2 is a partial fragmentary cross-sectional view of the printed circuit assembly of FIG. 1, taken along line 2—2.

Turning to FIG. 2, it can be seen that PCB 20 generally includes a base material or substrate 22 having opposing conductive layers 24 and 26 adhered thereto and interconnected by means of one or more plated through holes 32 bearing conductive material 34 formed thereon. In addition, opposing coverlayers 28 and 30 are adhered to PCB 20 to selectively cover portions of conductive layers 24 and 26.

Base substrate material 22 may be any insulating material which is suitable for use as a dielectric substrate. Examples of rigid materials suitable for use for base 22 include ceramic, glass epoxy, fabric, Teflon, paper phenolic or other composite materials. Examples of flexible materials suitable for use for base 22 include polyester, polyimide, PEN, as well as other polymer base materials. The typical thickness for rigid materials is between about 250 and 620 microns. The typical thicknesses for flexible materials is between about 25 and 125 microns.

The conductive material in layers 24 and 26 is typically a copper laminate, although other materials, including silver, gold, etc. may be used. Furthermore, circuit patterns are typically etched into conductive layers 24 and 26 by any known process, including additive, semi-additive or subtractive processes, among others. The thickness of conductive layers 24 and 26 is typically between about 40 and 60 microns.

Conductive layers 24 and 26 are electrically interconnected by means of plated through holes 32, including conductive material 34 deposited on the walls thereof. In most conventional PCB fabrication processes, the through holes are formed by drilling apertures in the base material 22 after initial formation of conductive layers 24 and 26. Then, by known electroless and electroplating processes, which may also include surface pretreatment, additional conductive material, such as copper, is plated in the walls of the through hole. Using conventional process steps, the through holes typically have a diameter of between about 0.3 mm and 1.1 mm, less the conductive material deposited on the walls thereof.

PCB 20 also includes insulating coverlayers 28, 30 on both sides thereon for insulating portions of the conductive layers 24, 26. Coverlayer 28 may be disposed in the area covered by overlay 40, or alternatively, an access aperture may be formed in coverlayer 28 to receive the overlay. In most conventional processes, the coverlayers are a dielectric film such as a polymer mask which is stamped to form a plurality of apertures in a desired arrangement for exposing selective portions of the conductive layers (e.g., the card connectors 12 as shown in FIG. 1). The thickness of coverlayers 28, 30 is typically between about 25 and 50 microns. Other known materials for coverlayers may also be used in the alternative.

Various alternative processes and materials may be used to fabricate PCB 20 consistent with the invention. For example, different multi-layer processes, including the use of plated through holes, may be used, as well as various adhesiveless processes both for the conductive layers and the coverlayers. For example, it has been found that pitches of 0.1 mm (50 micron line widths and spaces) and 0.15 mm via holes may be obtained on conventional printed circuit boards. However, it will generally be appreciated that this greater packaging density often comes at the expense of added cost and complexity in manufacture, thus negating many of the cost advantages of conventional cost sensitive PCB processes. Nonetheless, overlays consistent with the invention may be used with many types of PCB's regardless of their cost or complexity.

As shown in FIG. 1, a fine pitch flexible printed circuit overlay 40 is preferably bonded to PCB 20. Overlay 40 is preferably significantly smaller in size than PCB 20, thereby reducing its overall cost and minimizing the cost impact on printed circuit assembly 10. Different features such as complex routing schemes, multilayer connections, and bonding pads for direct attachment of unpackaged integrated circuit chips may be included on overlay 40 to provide the benefits of these technologies on PCB 20.

It will be appreciated that different components may be mounted on overlay 40. For instance, bonding pads for mounting unpackaged chips 70 and 71 (as seen in FIG. 1) may be provided. Other components, such as passive devices, active devices, etc. may also be mounted to overlay 40.

It will also be appreciated that any number of processes, materials and structures may be used in the construction of overlay 40. For example, any number of conductive layers may be used to further increase the packaging density available on overlay 40. Many of the preferred manufacturing techniques and materials for use in the preferred overlay 40 are described, for example, in U.S. Pat. application Ser. No. 08/142,243, filed by David A. Anderson et al. To the extent necessary to support this disclosure, the disclosures of this reference is incorporated by reference herein.

Turning to FIG. 2, overlay 40 is shown as a four layer multilayer construction, having two flexible dielectric substrates 42, 52 joined through a layer of conductive adhesive 74. It will be appreciated that any number of conductive layers may be provided on overlay 40, including single-sided, double-sided and multilayer constructions.

Flexible dielectric substrates 42 and 52 are preferably constructed from a polymeric film, such as polyimide, addition polymers, condensation polymers, natural polymers, treated films, or thermosetting or thermoplastic resins. Specifically, substrate materials such as polyethylene naphthylate, polyethylene terephthalate, fluorinated poly (ethylene-propylene) [FEP], polyvinyl fluoride (PVF), and aramide paper may be used. Rigid substrate materials, such as ceramics or rigid glass epoxy constructions may also be used; however, these rigid materials tend to be more expensive, and do not have the flexibility or thinness to which many of the advantages which the flexible substrate materials provide.

Substrates 42 and 52 are preferably between about 12 and 125 microns in thickness. In particular, flexible substrate polyimide films are commonly available in thicknesses of 25 and 50 microns, among others. Concerns such as flexibility, dielectric breakdown, or ground-to-ground separation for impedance purposes may be controlling factors on the selected thickness of the dielectric material used.

The flexible substrates 42, 52 preferably have a number of through holes 62 formed therein for interconnecting conductive layers deposited on opposing sides of the substrate materials. In the preferred embodiment, the through holes are formed by laser drilling, stamping, mechanical drilling or chemical etching prior to depositing conductive layers on the base substrate materials. For example, using laser drilling, through holes, or vias, having diameters of 25 microns or less may be constructed.

In the alternative, the through holes may be formed by a plated through hole process, whereby the holes are drilled and plated with conductive material, with an optional step of pretreating the through holes prior to metallization, after the conductive layers have been deposited on the base substrate material. However, it has been found that this process is not capable of attaining the same dimensions as other through hole forming methods.

Once through holes have been formed in the base substrate materials 42 and 52, conductive material is preferably deposited on both surfaces of the substrate, as well as in the through holes 62. The preferred process is an adhesiveless through hole metallization process, whereby a conductive material such as copper, aluminum, gold, silver, etc. is directly deposited on the surfaces of the substrate materials without the use of adhesives.

The preferred through hole metallization process is the subject matter of U.S. Pat. Nos. 5,112,462 and 5,137,791, which are incorporated by reference herein to the extent necessary to support this disclosure. According to this process, the substrate materials 42, 52 are subjected to plasma treatment in a plasma chamber to form thin, random, and preferably non-continuous distributions of metal oxide on the surfaces thereof and thereby condition the substrate for the deposition of conductive material thereon. In the plasma treatment step, cathodes constructed of materials such as chromium, titanium, iron, nickel, molybdenum, manganese, zirconium, or mixtures thereof, are preferably used to form the distributions of metal oxide.

The substrates, once treated, are then subjected to a vacuum deposition (evaporative) process to form thin layers of conductive material on the surfaces thereof and in the through holes. In this process, copper or another metal is vaporized at low pressure and high temperature and deposited preferably to a thickness of about 50 to 500 nanometers, most preferably about 200 nanometers. Next, an electroplating process known in the art is used to provide a conductive layer thicknesses of preferably between about 5 microns and 50 microns on the opposing surfaces and in the through holes of base substrates 42 and 52.

Circuit patterns are next formed in the conductive layers, for example to form patterned circuit layers 44 and 46 on base substrate 42, and patterned circuit layers 54 and 56 on base substrate 52. The preferred manner of forming the patterns of conductive material is a known photoresist etching process, whereby the conductive layers are etched through a photoresist mask which has been deposited on the substrate, imaged according to the desired circuit pattern, and selectively removed to form a mask. This technique is generally referred to as a subtractive deposition process. It will be appreciated, however, that other processes, including semi-additive and additive techniques, may be used in the alternative.

Using the preferred through hole metallization process, circuit traces, such as trace 57, may be patterned with a minimum pitch as small as about 50 microns (25 micron line widths and spacing). It will be appreciated that, based upon considerations such as current carrying density, resistance or speed integrity, the width of the conductive traces may vary.

Other techniques, or combinations of techniques, may be utilized to form conductive layers 44, 46, 54 and 56 on the base substrate materials. For example, any combination of vacuum deposition, chemical deposition, sputtering, plating, and/or other deposition techniques may be used. Also, other processes for pretreating a substrate to increase its adhesion properties, such as various oxidizing techniques, may also be used. In addition, adhesive based processes may be used, although they typically do not attain the same pitch as most adhesiveless processes.

The next step in the formation of overlay 40 is to deposit dielectric coverlayers on the opposing surfaces of base dielectric substrates 42, 52 to insulate desired portions of the conductive layers. This helps in providing electrical insulation, for example, from conductive adhesive layer 74, as well as to provide environmental resistance for the finished overlay.

In the preferred embodiment, dielectric coverlayers 48 and 50 are deposited on the opposing surfaces of base substrate 42, and coverlayers 58 and 60 are deposited on the surfaces of base substrate 52. However, it will be appreciated that one or more of the layers may be omitted, as only one dielectric layer is needed for each conductive adhesive layer.

The coverlayers are preferably photoimageable coverlayers that are deposited, photoimaged and developed over the conductive layers in a known manner. A number of apertures are defined therein for providing contact pads, such as pads 66, for bonding through a conductive adhesive layer, as well as for providing access to bonding pads for component assembly, such as bonding pad 68 for forming electrical connections with integrated circuit chip 70.

The dielectric material used in the coverlayers is preferably a photoimageable coverlayer material. The coverlayers may be deposited with a thickness of between about 5 and 10 microns, depending upon the required amount of dielectric protection or controlled impedance necessary for the particular application.

Other manners of forming dielectric coverlayers, including the deposition of dielectric inks by flood or screen printing operations, roll-to-roll processes such as bar coding or spraying, or stamped laminates bonded with or without the use of adhesives, may be used in the alternative. Further, various laser or chemical etching processes may be used.

For a multilayer overlay construction, base substrates 42 and 52, with the conductive layers 44, 46 and 54, 56, and dielectric coverlayers 48, 50 and 58, 60, are next bonded to one another through a conductive adhesive layer 74. The preferred conductive adhesive electrically and mechanically joins the opposing base substrates in the manner discussed in U.S. Pat. application Ser. No. 08/001,811, which is incorporated by reference herein to the extent necessary to support this disclosure.

The conductive adhesive layer 74 preferably includes a plurality of deformable heat fusible conductive particles 76 disposed in a thermosetting polymer matrix. The conductive particles are preferably solder balls which are sized to span the connected distance between the opposing conductive layers, typically between 90 and 110% of the distance between opposing conductive layers. However, relatively larger or smaller particles may be utilized with sufficient reliability for many applications.

In addition, the coefficient of thermal expansion of the solder particles is preferably matched with those of the dielectric substrate materials 42 and 52 to provide greater resistance to thermal stresses. Moreover, smaller particles may be used in addition to the primary particles to facilitate the formation of interconnections in the adhesive layer.

To connect base substrates 42 and 52, as well as to electrically interconnect conductive layers 44 and 56, the conductive adhesive material is preferably screen printed onto one of the laminates, either at selective locations or through a flood screen printing operation substantially throughout the surface area of overlay 40. The adhesive may also be formed into a B-stage film where it may then be cut, drilled, punched, etc. to form apertures as desired.

Once the conductive adhesive is screen printed, it is next dried to a B-stage adhesive, then the opposing assemblies are aligned overlapping with one another, with the opposing contact pads 66 aligned with one another. An optional known pre-cleaning step may also be used to condition the contact pads. The entire assembly is then laminated at an elevated temperature and pressure to cure and set the conductive adhesive layers. During lamination, the adhesive cures and sets, while the conductive particles reflow and wet to the opposing contact pads, whereby, after lamination, the conductive particles form solder bridges which are locked in place by the thermoset adhesive.

It will be appreciated that other methods for bonding substrate materials 42 and 52 together may be used consistent with the invention. Other processes, including other anisotropic or conductive adhesives, conductive epoxies, monosotropic adhesives, soldering, plated through holes, or thick film processes may be used. For example, plated through hole substrates may be bonded together with the selective application of anisotropic adhesive.

The connected distance between conductive layers across conductive adhesive layer 74 is preferably between about 5 and 25 microns after lamination. However, it will be appreciated that other thicknesses may be used depending on the particular application.

With the preferred construction for overlay 40, circuit trace pitches as low as 50 microns or less, and vias as small as 25 microns in diameter may be provided. Furthermore, overlay 40 will typically be much thinner than PCB 20. For example, using a 50 micron thickness for base substrate materials 42 and 52, with conductive layers deposited to a thickness of 5 microns, and coverlayers deposited to a thickness of 5 microns, double sided boards may be constructed having thicknesses of about 70 microns. Furthermore, being joined through a 25 micron thick conductive adhesive layer 74, the overall thickness of a four layer multilayer overlay 40 may be about 165 microns.

As discussed above, overlay 40 may include bonding pads for bonding different components such as chips 70 and 71 thereto. Furthermore, other assembly techniques, including the use of buried and blind vias, buried components, etc. may be designed into the construction of overlay 40 consistent with the invention.

Different processing techniques may be used to bond the unpackaged integrated circuit chips 70 and 71 to bonding pads formed in conductive layer 54 of overlay 40. For example, for bonding flip chips (i.e., unpackaged integrated circuit chips having solder bumps formed on one side thereof), one preferred direct chip attachment mechanism is disclosed in U.S. Pat. No. 5,261,593, issued to Casson et al.

To the extent necessary to support this disclosure, the disclosure of this reference is also incorporated by reference herein.

According to the Casson et al. process, a low temperature solder paste is registered on contact pads on the overlay, then one or more flip chips are registered on the overlay with the solder bumps on the chips centered on the solder paste on the contact pads. The solder paste is then reflowed by heating the entire assembly as a whole in an infrared reflow oven or other heat applying mechanism. The solder bumps and solder paste then form homogenous compositions which solidify to provide a mechanical and electrical interconnection between the flip chips and the overlay. It will be appreciated, however, that many other direct chip attachment techniques, such as tab, wire lead bonding, C4, etc. may be used in the alternative.

Overlay 40 is preferably bonded to PCB 20 through a conductive adhesive layer 78 having conductive particles 80 disposed in a thermosetting polymer matrix. Electrical connections between PCB 20 and overlay 40 are preferably made by a footprint of contact pads 36 on PCB 20 bonded to a matching footprint of contact pads 66 on overlay 40.

The preferred conductive adhesive layer 78 is the same as for conductive adhesive layer 74, although the size and dispersion of particles in the adhesive may be modified to optimize the performance of the conductive adhesive for the connected thickness between overlay 40 and PCB 20. It will be appreciated that suitable apertures in coverlayers 28 and 50 respectively disposed on PCB 20 and overlay 40 will be formed to expose the opposing contact pads 36 and 66 on PCB 20 and overlay 40.

It will be appreciated that different bonding processes may be used as an alternative to conductive adhesive layer 78 consistent with the invention, such as different conductive adhesives, conductive epoxies, monosotropic adhesives, soldering, etc.

In addition, it will be appreciated that the step of bonding overlay 40 to PCB 20 may be performed before or after populating the overlay and/or the PCB with components such as chips 70 and 71 or other passive or active devices. In fact, given the low profile (thinness) of overlay 40, all of the component populating steps, such as solder paste stenciling, automated component placement, wave soldering, etc., may be performed for assembly 10 at the same time, with overlay 40 already bonded to PCB 20. Moreover, even if overlay and PCB populating are performed in separate operations, the low profile overlay typically does not interfere with the normal populating steps for the PCB.

Furthermore, the preferred design of the substrates 42 and 52 and the conductive adhesive material for layers 74 and 78 is advantageous in that the substrates and adhesive are typically capable of withstanding the high temperatures and environmental stresses associated with many soldering and other component assembly processes.

Several advantages are realized by the use of a fine pitch overlay bonded to a conventional normal pitch PCB. First, the cost of the overall assemblies constructed therefrom is significantly reduced. High density/high performance circuit fabrication processes may be one or two orders of magnitude more expensive than conventional normal pitch PCB fabrication processes. Consequently, manufacturing an entire printed circuit assembly at a high pitch may not be commercially feasible for some applications.

On the other hand, using a small overlay providing the required packaging density and performance characteristics in a much smaller area, the overall cost impact on the printed circuit assembly may be minimized over constructing an entire assembly with advanced materials and processes. Furthermore, it may even be possible to eliminate the need for additional conductive layers and/or reduce the overall size of a PCB assembly through proper design of the overlay.

As an example, fine pitch/high performance PCB fabrication technologies may cost 50 cents per square inch for an PCB with 0.2 mm minimum pitch and 0.25 mm diameter vias. For a printed circuit assembly that is 5 inches by 10 inches, the cost would be $25.00 per board using fine pitch/high performance technologies for the entire board.

If, on the other hand, the same packaging density can be obtained using a one square inch overlay bonded to a more cost sensitive conventional PCB, the cost is significantly reduced. Conventional PCB technologies at normal pitches may cost only 12 cents per square inch for 0.3 mm minimum pitch and 0.375 mm diameter vias, resulting in a cost of $6.00 per board. Even assuming a cost of $1.50 per square inch for a high performance/ultra fine pitch 2 layer overlay having a minimum pitch of 100 microns and via diameters of 50 microns, the overall cost of the printed circuit assembly with a one square inch overlay is $7.50, resulting in a 70% cost reduction. The additional adhesive bonding materials and steps to connect the overlay to the PCB may also add to the cost of the final assemblies; however, this amount would be relatively nominal (typically about $0.50 per board).

Another advantage obtained by the use of an overlay is that many PCB fabrication technologies are simply not capable of attaining the same degree of pitch and performance as may be obtained with the above-described techniques used to construct overlay 40. Consequently, the advantages in high performance, high packaging density and increased reliability may be utilized on many conventional PCB's where previously not possible.

In addition, several advantages in flexibility of design are provided by the use of a fine pitch overlay bonded to a normal pitch PCB. Buried/blind vias, multilayers, direct chip attachment, and high density routing may be provided on a conventional PCB and overlay assembly with a minimal cost impact.

A further advantage of the use of the overlay is that the testing and burn-in of direct chip attach devices may be simplified since they may be attached to the overlay prior to PCB mounting, whereby a defective chip may not result in scrapping an entire assembly. Furthermore, repair of direct chip attach devices may be simplified as well by virtue of the overlay.

Figure 3:
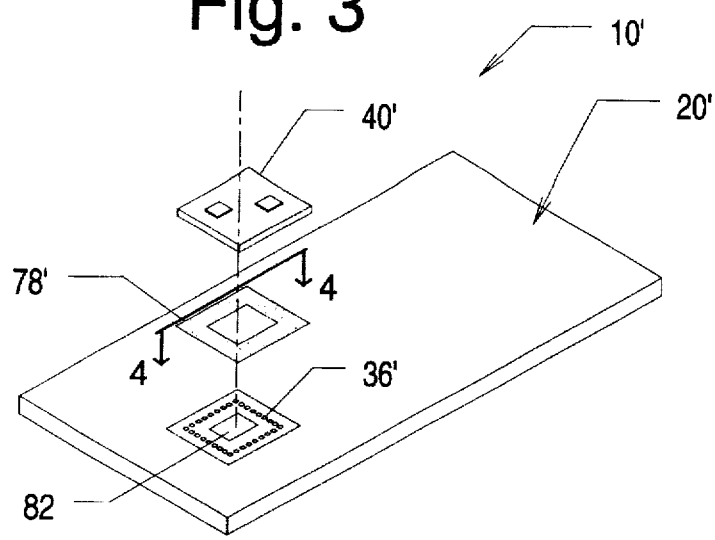
FIG. 3 is an exploded perspective view of an alternate printed circuit assembly consistent with the invention.
Figure 4:
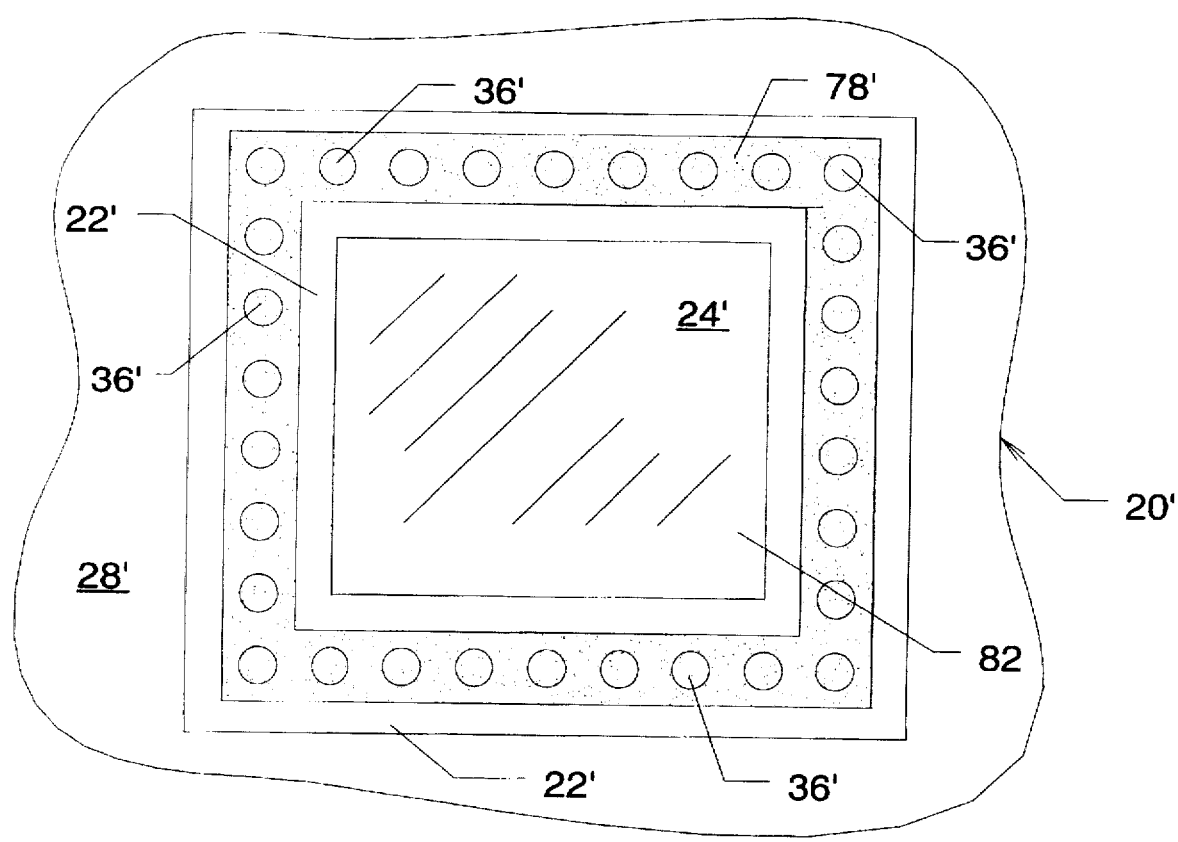
FIG. 4 is an enlarged fragmentary top plan view of the printed circuit board and connecting means for the assembly of FIG. 3, taken along line 4—4.

FIGS. 3 and 4 show an alternative printed circuit assembly construction which provides several additional beneficial techniques. FIG. 3 is an exploded perspective view of assembly 10' having an overlay 40' bonded to a footprint on a PCB 20' through a connecting means 78', and FIG. 4 shows the connecting means and the footprint of PCB 20' in more detail. PCB 20' includes a footprint of bonding pads 36' deposited on a base hardboard substrate hard board 22', suitable for bonding to overlay 40' having bonding pads disposed about its perimeter. The bonding pads are exposed by an aperture in a coverlayer 28'.

First, a "picture frame" of conductive adhesive 78' may be used as an alternative for bonding an overlay to PCB 20', rather than filling the entire area under the overlay with conductive adhesive material. It is believed that some improvements in reliability may be realized by this construction as the overlay will be able to "float" on the PCB to better distribute stress, improve flatness, and accommodate for x–y expansion due to differences in thermal coefficient of expansion between overlay 40 and PCB 20. The overlay would be better able to shrink and expand in thermal cycling with a lesser possibility of causing failure in conductive adhesive layer 78'.

Second, it is believed that another improvement may be through the use of a solid ground plane 82 formed directly under overlay 40 in conductive layer 24'. It is believed that the use of the ground plane, built into the PCB, would tend to improve signal integrity by providing additional shielding protection. Further, the ground plane may also provide additional heat sinking functions for the assembly and provide a relatively flat surface under the overlay.

It will be appreciated that various other modifications in changes may be made to the preferred embodiments without departing from the spirit and scope of the invention. Therefore, the invention lies in the claims hereafter appended.

What is claimed is:

1. A printed circuit assembly comprising:
   (a) a normal pitch printed circuit board having bonding pads arranged into a footprint on a surface thereof;
   (b) a fine pitch flexible printed circuit overlay having bonding pads arranged into a footprint on a surface thereof, wherein the overlay has a minimum pitch of less than about 0.25 mm and at least one through hole with a diameter of less than about 0.3125 mm; and
   (c) connecting means for mechanically connecting the overlay to the board and electrically connecting the bonding pads on the overlay to the bonding pads on the board.

2. The printed circuit assembly of claim 1, wherein the overlay has a minimum pitch of less than about 0.1 mm.

3. The printed circuit assembly of claim 2, wherein the overlay has a minimum pitch of about 50 microns.

4. The printed circuit assembly of claim 1, wherein the through hole has a diameter of less than about 0.15 mm.

5. The printed circuit assembly of claim 4, wherein the through hole has a diameter of about 25 microns.

6. The printed circuit assembly of claim 1, wherein the board has a minimum pitch of at least 0.25 mm.

7. The printed circuit assembly of claim 6, wherein the board has at least one through hole, wherein the minimum diameter of the through hole is at least 0.3125 mm.

8. The printed circuit assembly of claim 1, wherein the overlay has a minimum pitch which is less than about 60 percent of a minimum pitch for the board.

9. The printed circuit assembly of claim 8, wherein the overlay has a minimum pitch which is less than about 40 percent of the minimum pitch for the board.

10. The printed circuit assembly of claim 1, further comprising an unpackaged integrated circuit chip directly mounted to the overlay and electrically interconnected with a footprint of bonding pads on the overlay.

11. The printed circuit assembly of claim 10, further comprising a second unpackaged integrated circuit chip directly mounted to the overlay and electrically interconnected with a second footprint of bonding pads on the overlay.

12. The printed circuit assembly of claim 1, wherein the board includes a layer of conductive material disposed substantially throughout an area on a surface of the board overlapped by the overlay for shielding electrical interference and conducting heat away from the overlay.

13. The printed circuit assembly of claim 1, wherein the connecting means comprises a conductive adhesive.

14. The printed circuit assembly of claim 13, wherein the conductive adhesive is disposed substantially throughout an area on the board overlapped by the overlay.

15. The printed circuit assembly of claim 13, wherein the footprint of bonding pads on the overlay are disposed about a perimeter of the overlay, and wherein the conductive adhesive is interposed between the overlay and board proximate the footprint of bonding pads in the overlay to leave a central portion of the overlay that is not mechanically connected to the board by the conductive adhesive.

16. The printed circuit assembly of claim 13, wherein the conductive adhesive is interposed between the board and overlay to define a connected distance between opposing conductive layers formed on the overlay and board, wherein the conductive adhesive layer includes a non-conductive adhesive having a plurality of deformable conductive metallic particles dispersed substantially uniformly throughout the adhesive such that each particle is electrically insulated from substantially every other particle, and wherein the particles have a diameter that is about 90–110% of the connected distance; whereby the conductive adhesive is conductive across a thickness thereof and is non-conductive throughout a coplanar direction thereof.

17. The printed circuit assembly of claim 1, wherein the overlay includes an adhesiveless laminate comprising:
   (a) a flexible dielectric substrate;
   (b) first and second conductive layers of conductive material secured to opposing surfaces of the flexible dielectric substrate through adhesiveless interconnections; and
   (c) at least one metallized through hole defined through the flexible dielectric substrate and having conductive material deposited thereon to electrically interconnect the first and second conductive layers.

18. The printed circuit assembly of claim 17, wherein the flexible dielectric substrate comprises a polyimide film having a thickness of at most about 50 microns.

19. The printed circuit assembly of claim 17, wherein the opposing surfaces of the flexible dielectric substrate include non-continuous random distributions of metal-oxide selected from the group consisting of oxides of iron, chromium, nickel, molybdenum, manganese, zirconium or mixtures thereof; and wherein the conductive material in the first and second conductive layers and the at least one metallized through hole comprises a first metal layer, formed on the random distributions by vapor metallization, having a thickness of about 50 to 500 nanometers, and a second metal layer electroplated on the first metal layer to form a thickness of at most about 35 microns for the conductive layers and the metallized through hole.

20. The printed circuit assembly of claim 19, wherein the conductive material in the first and second conductive layers and the at least one metallized through hole comprises copper having a thickness of at most about 5 microns.

21. The printed circuit assembly of claim 17, further comprising at least one adhesiveless dielectric layer disposed over a surface of the adhesiveless laminate.

22. The printed circuit assembly of claim 21, wherein the adhesiveless dielectric layer comprises a photoimaged coverlayer.

23. The printed circuit assembly of claim 17, wherein the overlay further includes a second adhesiveless laminate electrically and mechanically interconnected with the first adhesiveless laminate through a conductive adhesive layer.

24. A printed circuit assembly comprising:
(a) a normal pitch printed circuit board having bonding pads arranged into a footprint on a surface thereof;
(b) a fine pitch flexible printed circuit overlay having bonding pads arranged into a footprint on a surface thereof and having a minimum circuit trace pitch of less than about 0.1 mm, the overlay including an adhesiveless laminate including:
  (i) a flexible dielectric substrate;
  (ii) first and second conductive layers of conductive material secured to opposing surfaces of the flexible dielectric substrate through adhesiveless interconnections; and
  (iii) at least one metallized through hole defined through the flexible dielectric substrate and having conductive material deposited thereon to electrically interconnect the first and second conductive layers, the metallized through hole having a diameter of less than about 0.15 mm; and
(c) a conductive adhesive layer, interposed between the overlay and the board, for mechanically connecting the overlay to the board and electrically connecting the bonding pads on the overlay to the bonding pads on the board.

25. The printed circuit assembly of claim 24, wherein the overlay has a minimum pitch which is less than about 60 percent of a minimum pitch for the board.

26. The printed circuit assembly of claim 24, further comprising an unpackaged integrated circuit chip directly mounted to the overlay and electrically interconnected with a footprint of bonding pads on the overlay.

27. The printed circuit assembly of claim 26, further comprising a second unpackaged integrated circuit chip directly mounted to the overlay and electrically interconnected with a second footprint of bonding pads on the overlay.

28. The printed circuit assembly of claim 24, wherein the board includes a layer of conductive material disposed substantially throughout an area on a surface of the board overlapped by the overlay for shielding electrical interference and conducting heat away from the overlay.

29. The printed circuit assembly of claim 24, wherein the conductive adhesive is disposed substantially throughout an area on the board overlapped by the overlay.

30. The printed circuit assembly of claim 24, wherein the footprint of bonding pads on the overlay are disposed about a perimeter of the overlay, and wherein the conductive adhesive is interposed between the overlay and board proximate the footprint of bonding pads in the overlay to leave a central portion of the overlay that is not mechanically connected to the board by the conductive adhesive.

31. The printed circuit assembly of claim 24, further comprising a second fine pitch flexible printed circuit overlay having bonding pads arranged into a footprint on a surface thereof and electrically and mechanically interconnected to the printed circuit board.

* * * * *